United States Patent [19]

Shiga

[11] Patent Number: 5,389,807
[45] Date of Patent: Feb. 14, 1995

[54] FIELD EFFECT TRANSISTOR

[75] Inventor: Nobuo Shiga, Yokohama, Japan

[73] Assignee: Sumitomo Electric Industries, Ltd., Japan

[21] Appl. No.: 110,937

[22] Filed: Aug. 24, 1993

[30] Foreign Application Priority Data

Sep. 3, 1992 [JP] Japan .................. 4-235946

[51] Int. Cl.$^6$ .............................. H01L 33/00
[52] U.S. Cl. .................... 257/280; 257/281
[58] Field of Search ................. 257/280, 281

[56] References Cited

FOREIGN PATENT DOCUMENTS 285206 10/1988 European Pat. Off. .
492666 7/1992 European Pat. Off. .

OTHER PUBLICATIONS

Patent Abstracts of Japan, vol. 8, No. 66 (E-234) 28 Mar. 1984 & JP-A-58 215 077 (Nippon Denki K.K.) 14 Dec. 1983.
Patent Abstracts of Japan, vol. 007, No. 182 (E-192) 11 Mar. 1983 & JP-A-58 087 875 (Hitachi Seisakushio KK) 25 May 1983.
Patent Abstracts of Japan, vol. 013, No. 439 (E-827) 3 Oct. 1989 & JP-A-01 116 569 (Hitachi Ltd.) 30 Jun. 1989.
Patent Abstracts of Japan, vol. 8, NO. 44 (E-229) 25 Feb. 1984 & JP-A-58 201 375 (Nippon Denki K.K.) 24 Nov. 1983.
Patent Abstracts of Japan, vol. 6, No. 123 (E-117) (1001) 8 Jul. 1982 & JP-A-57 052 174 (Nippon Denki K.K.) 27 Mar. 1982.
Patent Abstracts of Japan, vol. 014, No. 346 (E-0956) 26 Jul. 1990 & JP-A-02 119 145 (Sony Corp) 7 May 1990.

Primary Examiner—Ngân V. Ngô
Assistant Examiner—Stephen D. Meier
Attorney, Agent, or Firm—Beveridge, DeGrandi, Weilacher & Young

[57] ABSTRACT

It is an object of the present invention to provide a dual-gate type MESFET having a high drain breakdown voltage and excellent high-frequency characteristics. A semiconductor substrate used in the present invention is obtained by sequentially forming a non-doped buffer layer 2, a thin first pulse-doped layer 3 having a high impurity concentration, and a cap layer 7 on an underlying semiconductor substrate 1 by epitaxial growth. The cap layer 7 has a thin second pulse-doped layer 5 having a high impurity concentration sandwiched between non-doped layers 4 and 6. The thickness and impurity concentration of the second pulse-doped layer 5 are set such that the second pulse-doped layer 5 is depleted by a surface depletion layer caused by the interface state of the cap layer surface, and the surface depletion layer does not extend to the first pulse-doped layer 3. A source electrode 13, a drain electrode 16, and first and second gate electrodes 14 and 15 are formed on the semiconductor substrate surface. High-impurity-concentration ion implantation regions 10, 11, and 12 are formed at a source electrode formation region, a drain electrode formation region, and a region between the first and second gate electrode formation regions to extend from the semiconductor substrate surface to the first pulse-doped layer 3. The second electrode 15 formed on the drain electrode 16 side is sufficiently separated from the high-impurity-concentration ion implantation region 12 below the drain electrode 16.

13 Claims, 3 Drawing Sheets

1

FIELD EFFECT TRANSISTOR

BACKGROUND OF THE INVENTION

1. Field of the Invention

The present invention relates to a Schottky-barrier type field effect transistor (MESFET) and, more particularly, to a dual-gate type field effect transistor (FET) having two gate electrodes between a source and drain electrodes.

2. Related Background Art

With the recent rapid development in information network systems, the demands for satellite communication systems have been rapidly increasing, and the frequency band is getting higher and higher. A high-frequency FET, especially a MESFET consisting of GaAs, has been put into practical use as a transistor which can overcome the characteristic limit of a silicon bipolar transistor conventionally used in a high-frequency circuit.

In order to realize a high-output, high-efficiency GaAs MESFET, it is important to decrease the resistance between the source and gate electrodes, i.e., the source resistance (Rs), and increase the transconductance (gm) while increasing the drain breakdown voltage between the gate and drain electrodes.

In a dual-gate type MESFET, in order to increase the drain breakdown voltage, the drain-side gate electrode, i.e., the second gate electrode, may be formed apart from a high-impurity-concentration ion implantation region on the drain electrode side.

In this case, a gate elongation effect is caused to increase the effective gate length in a range where the gate bias is low, i.e., a range where the gate bias is a negative value close to 0 V if the FET is n-channel FET. As a result, the transconductance gm of the FET is decreased in the range.

SUMMARY OF THE INVENTION

It is an object of the present invention to increase the drain breakdown voltage of a dual-gate type MESFET without decreasing the transconductance gm.

In order to achieve the above object, a field effect transistor of the present invention comprises a semiconductor substrate having a non-doped buffer layer, a thin first pulse-doped layer with a high impurity concentration, and a cap layer sequentially formed on an underlying semiconductor substrate by epitaxial growth. The cap layer has a thin second pulse-doped layer with a high impurity concentration sandwiched between non-doped layers. The second pulse-doped layer has a thickness and an impurity concentration set such that the second pulse-doped layer is depleted by a surface depletion layer caused by interface state of a surface of the cap layer, and the surface depletion layer does not extend to the first pulse-doped layer. A source electrode, a drain electrode, and first and second gate electrodes are formed on a surface of the semiconductor substrate. High-impurity-concentration ion implantation regions are formed at a source electrode formation region, a drain electrode formation region, and a region between the first and second gate electrode formation regions to extend from the surface of the semiconductor substrate to the first pulse-doped layer. The second gate electrode formed on the drain electrode side is separated from the high-impurity-concentration ion implantation region below the drain electrode.

When the second gate electrode is separated from the high-impurity-concentration ion implantation region on the drain electrode side, a surface depletion layer due to the interface state of the substrate surface is formed in the separated portion as well as in a portion below the second gate electrode. However, extension of this surface depletion layer in the direction of depth is prevented by the second pulse-doped layer in the cap layer. Consequently, the first pulse-doped layer as a channel layer is free from the influence of the surface depletion layer, and only the depletion layer immediately below the second gate electrode has an effective influence on the channel layer. That is, no increase in effective gate length occurs. Therefore, no reduction in the transconductance gm on the low-gate-bias range occurs, and the transconductance gm becomes constant with respect to a wide range of changes in gate bias.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

Figure 1:
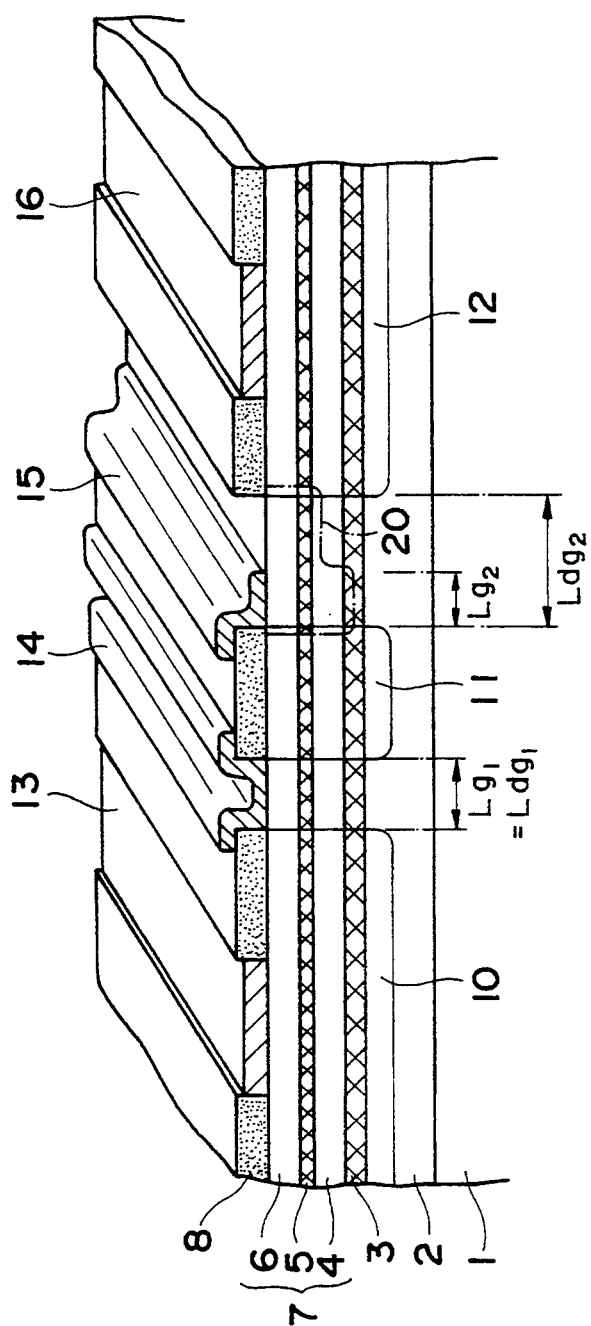
FIG. 1 is a perspective view showing an exposed cross-sectional surface according to the first embodiment of the present invention.
Figure 2:
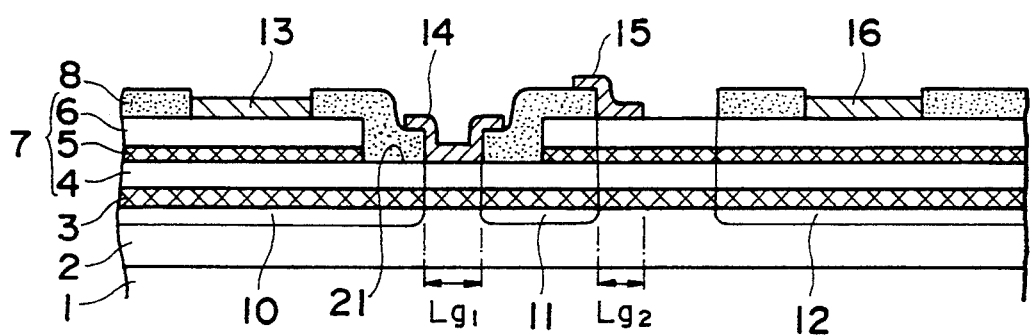
FIG. 2 is a sectional view showing the second embodiment of the present invention.
Figure 3:
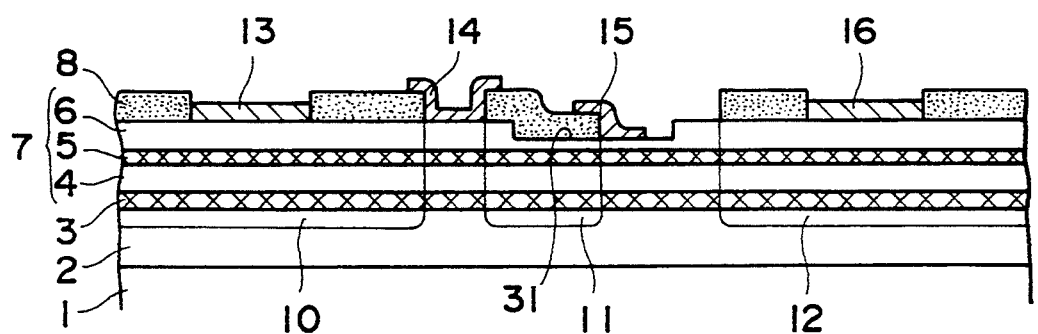
FIG. 3 is a sectional view showing the third embodiment of the present invention.
Figure 4:
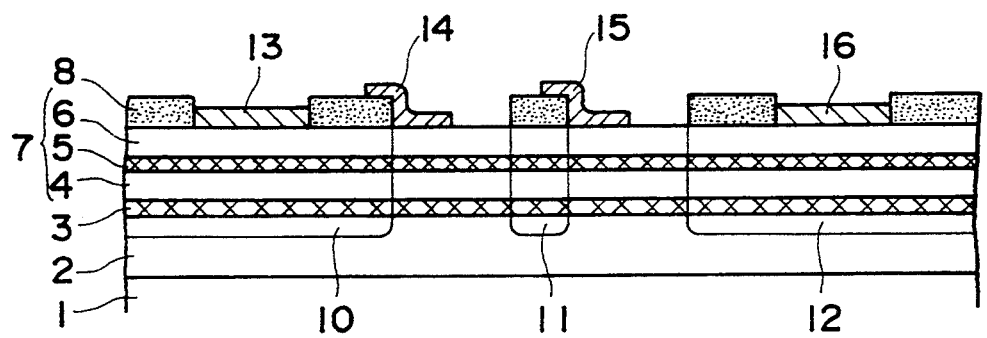
FIG. 4 is a sectional view showing the fourth embodiment of the present invention.
Figure 5:
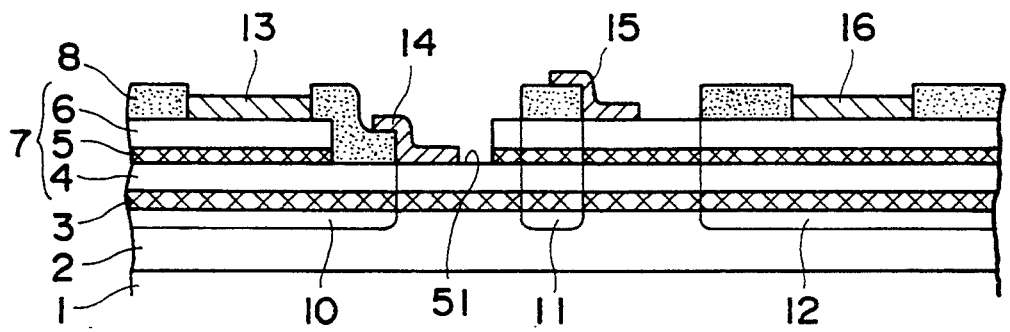
FIG. 5 is a sectional view showing the fifth embodiment of the present invention.
Figure 6:
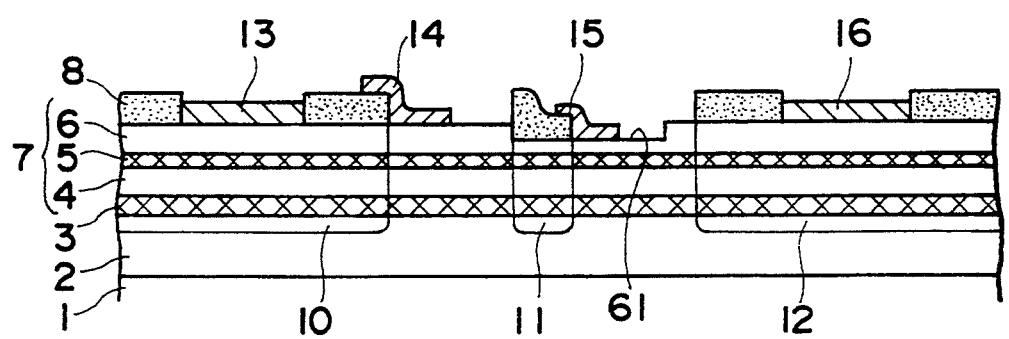
FIG. 6 is a sectional view showing the sixth embodiment of the present invention.
Figure 7:
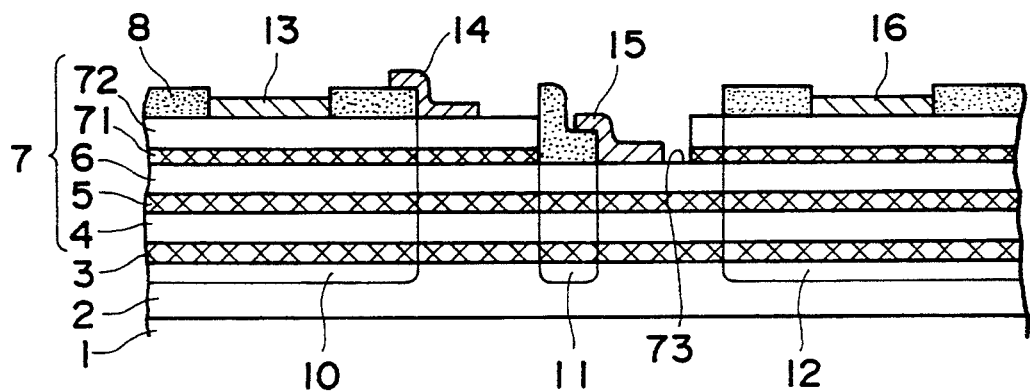
FIG. 7 is a sectional view showing the seventh embodiment of the present invention.

A dual-gate MESFET according to an embodiment of the present invention will be described first with reference to FIG. 1. A non-doped GaAs buffer layer 2 is formed on a semi-insulating GaAs semiconductor substrate 1. This buffer layer is formed by a crystal growth technique such as the MBE method (molecular beam epitaxy method) or the OMVPE method (organic metal vapor phase epitaxy method). In order to improve the carrier trapping property of a channel layer 3 (to be described later), the conductivity type of the buffer layer 2 is set to be p conductivity type by controlling the supply ratio of a Group V material to a Group III material. The carrier density of the GaAs buffer layer 2 is set to be, e.g., $2.5 \times 10^{15}$ cm$^{-3}$.

An Si-doped n-type first GaAs pulse-doped layer 3 is formed on the buffer layer 2. The pulse-doped layer 3 has a high carrier density, $4 \times 10^{18}$ cm$^{-3}$, and a small thickness, 200 Å. A cap layer 7 constituted by a non-doped GaAs layer 4, a second GaAs pulse-doped layer 5, and a non-doped GaAs layer 6 is formed on the pulse-doped layer 3 by a crystal growth technique such as the MBE method or the OMVPE method. The non-doped GaAs layer 4 is of n conductivity type and has a carrier density of $1 \times 10^{15}$ cm$^{-3}$ or less, and a thickness of 150 Å. The second GaAs pulse-doped layer 5 is an Si-doped layer of n conductivity type, which has the same high carrier density as that of the first pulse-doped layer 3, i.e., $4 \times 10^{18}$ cm$^{-3}$, and a thickness of 50 Å. The non-doped GaAs layer 6 is of n conductivity type and has a carrier density of $1 \times 10^{15}$ cm$^{-3}$ or less and a thickness of 200 Å.

The thickness and impurity concentration of the second GaAs pulse-doped layer 5 are set such that the second GaAs pulse-doped layer 5 is depleted by a surface depletion layer caused by the interface state of the substrate surface, i.e., the surface of the non-doped GaAs layer 6, and the surface depletion layer does not extend to the first pulse-doped layer 3.

Gate electrodes and high-impurity-concentration ion implantation regions are formed on the epitaxial wafer having such a laminated structure by a self alignment technique or the like. In addition, a source electrode and a drain electrode are formed on the wafer. High-impurity-concentration ion implantation regions 10 to 12 are formed by two steps below. The first step is forming first and second dummy gates (not shown), consisting of a photoresist, on first and second gate electrode formation regions. And the second step is implanting Si ions using the first and second dummy gates as masks. Thereafter, an inorganic insulating film such as an SiO$_2$ film is deposited on the entire surface of the resultant structure. The SiO$_2$ film is lifted off by using the first and second dummy gates to form an SiO$_2$ film 8 having openings in the first and second gate electrode formation regions. Portions, of the SiO$_2$ film 8, which correspond to source and drain electrode formation regions are removed, and deposition of an Ohmic metal and a lift-off process are performed, thus forming a source electrode 13 and a drain electrode 16. Deposition of a Schottky metal and a lift-off process are performed to form first and second gate electrodes 14 and 15.

A gate length $L_{dg2}$ of the second dummy gate on the drain side is set to be larger than a gate length $L_{dg1}$ of the first dummy gate on the source side. The first gate electrode 14 overlaps the high-impurity-concentration ion implantation regions 10 and 11 through the SiO$_2$ film 8, whereas the second gate electrode 15 overlaps only the high-impurity-concentration ion implantation region 11 through the SiO$_2$ film 8. With this structure, the first gate electrode 14 has a so-called self-aligned structure with respect to the high-impurity-concentration ion implantation regions 10 and 11 so that a gate length $L_{g1}$ can be shortened to the limit of a lithographic technique used in the formation of a dummy gate. In addition, the second gate electrode 15 can be sufficiently separated from the high-impurity-concentration ion implantation region 12 on the drain side.

According to the dual-gate type MESFET having the above-described arrangement, since the second gate electrode 15 is sufficiently separated from the high-impurity-concentration ion implantation region 12 on the drain side, the drain breakdown voltage is high. Furthermore, since the cap layer 7 in this separated portion includes the second GaAs pulse-doped layer 5, the gate elongation effect due to a surface depletion layer can be suppressed. Therefore, the effective gate length in the second gate electrode 15 is almost equal to a gate length $L_{g2}$, and hence can be sufficiently reduced to a length almost equal to the gate length of the first gate electrode 14 having the self-aligned structure. A depletion layer 20 in FIG. 1 is in a state wherein a negative gate voltage is applied to the second gate electrode 15. As is apparent from FIG. 1, the depletion layer 20 constricts the channel (first pulse-doped layer 3) only at a position immediately below the second gate electrode 15. A portion of the depletion layer 20 between the second gate electrode 15 and the high-impurity-concentration ion implantation region 12 is caused by the interface state of the surface of the cap layer 7 and is prevented by the second pulse-doped layer 5 from extending downward. When a high-frequency signal is input to only the first gate electrode 14, and the second gate electrode 15 is used for gain control, the gate length $L_{g2}$ of the second gate electrode 15 need not be reduced so much as in the above case. Thus, the manufacturing yield of the MESFET of the embodiment applied in such a manner is very high. When the second gate electrode 15 is separated from the high-impurity-concentration ion implantation region 12 on the drain side, a drain conductance gd becomes small. Since the gain of an FET increases with an increase in gm/gd, an FET having a high gain can be manufactured.

FIGS. 2 to 7 are sectional views showing the second to seventh embodiments of the dual-gate type MESFET of the present invention. The same reference numerals in the second to seventh embodiments denote the same parts as in the first embodiment, and a repetitive description will be avoided. The differences between the first embodiment and the remaining embodiments will be mainly described below.

In the second embodiment (FIG. 2) and the third embodiment (FIG. 3), a cap layer 7 has a trench in either a first gate electrode formation region or a second gate electrode formation region. When a trench portion 21 or 31 is formed in the cap layer 7 to shorten the distance between a gate electrode 14 or 15 and a channel layer 3, the threshold voltage can be set to be low, i.e., can be reduced toward 0 V. With this structure, first and second gate electrodes 14 and 15 can have different threshold voltages and different pinch-off voltages in the each embodiment. The depth of a trench portion can be set to be a predetermined value by controlling the etching time.

In the fourth embodiment (FIG. 4), the fifth embodiment (FIG. 5), and the sixth embodiment (FIG. 6), only one side of a first gate electrode 14 overlaps a high-impurity-concentration ion implantation region 10 through the SiO$_2$ film 8, similar to a second gate electrode 15. With this structure, a higher drain breakdown voltage can be obtained. Similar to the second embodiment (FIG. 2) and the third embodiment (FIG. 3), the fifth embodiment (FIG. 5) and the sixth embodiment (FIG. 6) are designed such that trench portions 51 and 61 are formed to allow the first and second gate electrodes 14 and 15 to have different threshold voltages.

In the seventh embodiment (FIG. 7), a third pulse-doped layer 71 and a non-doped GaAs layer 72 are added to a cap layer 7 in the sixth embodiment to form a five-layer structure. In this structure, since the two pulse-doped layers for preventing extension of a surface depletion layer in the direction of depth are formed, the depth of a trench portion 73 for threshold voltage adjustment can be further increased.

As has been described above, according to the present invention, in the dual-gate type MESFET, since the second gate electrode is sufficiently separated from the high-impurity-concentration ion implantation region on the drain side, a high drain breakdown voltage can be obtained. In addition, since the cap layer includes the pulse-doped layer for preventing extension of a surface depletion layer in the direction of depth, the gate elongation effect in the second gate electrode is suppressed to improve the linearity of the transconductance gm, thereby realizing excellent high-frequency characteristics.

What is claimed is:

1. A field effect transistor comprising:
   a semi-insulating semiconductor substrate,
   a non-intentionally doped buffer layer formed on said semi-insulating semiconductor substrate,
   a thin first pulse-doped layer having a high impurity concentration and being formed on said buffer layer,
   a cap layer structure formed on said thin first pulse-doped layer, said cap layer structure including,
   a first non-intentionally doped layer
   a thin second pulse-doped layer having a high impurity concentration and formed in direct contact with said first non-intentionally doped layer, and
   a second non-intentionally doped layer formed on said thin second pulse-doped layer;
   high-impurity-concentration ion implantation regions formed in said second non-intentionally doped layer to define a source electrode formation region and a drain electrode formation region, respectively,
   a high-impurity-concentration ion implantation region formed between and isolated from said source and said drain electrode formation regions to define a gate electrode formation region which extends into said buffer layer,
   a source electrode formed on said source electrode formation region,
   a drain electrode formed on said drain electrode formation region,
   first and second gate electrodes formed on said gate electrode formation region, and
   an insulating layer covering upper surfaces of said electrode regions that are not covered by said electrodes.

2. A transistor according to claim 1, wherein said first gate electrode is provided between said source electrode and said second gate electrode, said second gate electrode being provided between said first gate electrode and said drain electrode, and wherein said second gate electrode is separated from said drain electrode formation region by a distance sufficient to obtain a desired drain breakdown voltage.

3. A transistor according to claim 2, wherein said semiconductor substrate, said buffer layer, said first pulse-doped layer, and said cap layer structure are made of GaAs.

4. A transistor according to claim 3, wherein said buffer layer has a p-type conductivity, and said first pulse-doped layer and said cap layer structure have an n-type conductivity.

5. A transistor according to claim 4, wherein an impurity in said first pulse-doped layer and in said second pulse-doped layer is Si.

6. A field effect transistor according to claim 1, wherein one of said first and second gate electrodes is formed on a portion of said second non-intentionally doped layer that is relatively thinner, in a direction perpendicular to said substrate, than the other of said first and second gate electrodes.

7. A field effect transistor according to claim 1, wherein one of said first and second gate electrodes is in direct contact with said first non-intentionally doped layer.

8. A field effect transistor according to claim 1, wherein said second pulse-doped layer has a thickness and an impurity concentration set such that said second pulse-doped layer is depleted by a surface depletion layer caused by an interface state of a surface of said cap layer structure, and wherein the surface depletion layer does not extend to said first pulse-doped layer.

9. A field effect transistor comprising:
   a semi-insulating semiconductor substrate layer;
   a non-intentionally doped buffer layer formed on said semi-insulating semiconductor substrate layer;
   a first pulse-doped thin layer having a impurity concentration and formed on said buffer layer;
   a cap layer structure formed on said first pulse-doped thin layer, said cap layer structure including,
   a first non-intentionally doped layer,
   a second pulse-doped thin layer having a high impurity concentration and being in direct contact with said first non-intentionally doped layer, and
   a second non-intentionally doped layer formed on said second pulse-doped thin layer;
   a source high impurity region extending from an upper surface of said cap layer structure to said buffer layer,
   a drain high impurity region extending from the upper surface of said cap layer structure to said buffer layer,
   source and drain electrodes respectively formed on an upper surface of said source and drain high impurity regions, and in ohmic contact therewith;
   a first and a second gate electrode located between said source and drain electrodes, said first and second gate electrodes being spaced apart wherein a distance between said first gate electrode and said source electrode is shorter than a distance between said second gate electrode and said drain electrode; and
   an ion implanted region extending from said cap layer structure, between said first and second gate electrodes to said buffer layer,
   said ion implanted region having a high impurity concentration and being isolated from said source and drain high impurity regions, and wherein
   a minimum distance between said first gate electrode and said source high impurity region being shorter than a minimum distance between said second gate electrode and said drain high impurity region.

10. A field effect transistor according to claim 9, further comprising an insulating layer over an upper surface of said ion implanted region.

11. A field effect transistor according to claim 10, wherein a portion of said second gate electrode partially overlaps a portion of said insulating layer which insulating layer is over said ion implanted region between gate electrodes.

12. A field effect transistor according to claim 10, wherein said second gate electrode is in contact with an upper surface of said cap layer structure, and said first gate electrode is in contact with said first non-intentionally doped layer.

13. A field effect transistor according to claim 10, wherein first and second gate electrodes contact with said upper surface of said cap layer structure and said second non-intentionally doped layer under said first gate electrode is relatively thicker, in a direction perpendicular to said substrate layer, than said second non-intentionally doped layer under said second gate electrode.

* * * * *